United States Patent
Lin et al.

[11] Patent Number: 6,127,226
[45] Date of Patent: Oct. 3, 2000

[54] METHOD FOR FORMING VERTICAL CHANNEL FLASH MEMORY CELL USING P/N JUNCTION ISOLATION

[75] Inventors: Chrong-Jung Lin; Jong Chen, both of Taipei; Shui-Hung Chen, Hsin-Chu; Di-Son Kuo, Hsinchu, all of Taiwan

[73] Assignee: Taiwan Semiconductor Manufacturing Company, Hsin-Chu, Taiwan

[21] Appl. No.: 08/995,998

[22] Filed: Dec. 22, 1997

[51] Int. Cl.[7] ............................................. H01L 21/8247
[52] U.S. Cl. ........................... 438/259; 438/270; 438/589
[58] Field of Search ................................. 438/259, 264, 438/268, 270, 524, 589, 593, 594

[56] References Cited

U.S. PATENT DOCUMENTS

| | | | |
|---|---|---|---|
| 5,045,490 | 9/1991 | Esquivel et al. | 437/43 |
| 5,229,312 | 7/1993 | Mukherjee et al. | 438/259 |
| 5,429,970 | 7/1995 | Hong | 438/259 |
| 5,468,663 | 11/1995 | Bertin et al. | 438/259 |
| 5,563,083 | 10/1996 | Pein | 437/43 |
| 5,587,949 | 12/1996 | Bergemont et al. | 365/185.24 |
| 5,595,927 | 1/1997 | Chen et al. | 437/52 |

*Primary Examiner*—Chandra Chaudhari
*Attorney, Agent, or Firm*—George O. Saile; Stephen B. Ackerman; Graham S. Jones, II

[57] ABSTRACT

This is a method of forming a vertical memory device on a semiconductor substrate. Start by forming an initial mask with a first array of parallel strips, with a first orientation, on the surface of a silicon oxide layer on a substrate. Then form another mask with transverse strips to form gate trench openings between the first array of strips and the transverse strips. Next, etch floating gate trenches in the substrate through the gate trench openings. Dope the walls of the trenches with a threshold implant and remove exposed portions of the mask. Form source/drain regions in the substrate self-aligned with the floating gate electrode. Strip the remainder of the masks. Form a tunnel oxide layer on the trench surfaces and a floating gate electrode in the trench on the tunnel oxide layer. Above the source/drain regions, form source drain conductor lines in the substrate in a parallel array. Form an ONO dielectric layer and a control gate electrode over the top surface of the floating gate electrode and an array of P/N isolation regions in the silicon semiconductor substrate.

32 Claims, 7 Drawing Sheets

METHOD FOR FORMING VERTICAL CHANNEL FLASH MEMORY CELL USING P/N JUNCTION ISOLATION

BACKGROUND OF THE INVENTION

1. Field of the Invention

This invention relates to semiconductor memory devices and more particularly to a method of manufacture of vertical channel flash memory devices.

2. Description of Related Art

1. To maintain enough current through channel regions conventional memory cells require more chip surface area with traditional ETOX (nonvolatile memory with a metal drain line that contacts each drain region in a column of drain regions) structures since the channel is parallel to the wafer surface.
2. Field oxide regions are used to provide isolation for conventional ETOX structure requiring space between memory cells.
3. During programming and erasing procedures, the tunneling electrons always.need to pass through part of the channel area resulting in charge trapping and transconductance degradation.

See the references as follows:

U.S. Pat. No. 5,045,490 of Esquivel et al. for "Method of Making a Pleated Floating Gate Trench EPROM";

U.S. Pat. No. 5,595,927 of Chen et al. for "Method for Making Self-Aligned Source/Drain Mask ROM Memory Cell Using Trench Etched Channel"; and U.S. Pat. No. 5,563,083 of Pein for "Method of Fabricating Non-Volatile Sidewall Memory Cell".

SUMMARY OF THE INVENTION

1. A cell structure in accordance with this invention uses a vertical channel but not the traditional horizontal one.
2. A cell structure in accordance with this invention can be packed more densely for a cell array since the channel is vertical with respect to the wafer surface.
3. The P/N junction is used for isolation instead of a field oxide layer at the reverse bias for the P/N junction.
4. The stacked gate structure is planarized in accordance with this invention.
5. During the erasing procedure, the band-to-band hot hole phenomenon can be completely prevented with a cell structure in accordance with this invention.

Improvements provided by this invention are as follows:

1. The unit cell can take requires less surface area but provides an enlarged channel area.
2. Because the floating gate is under the wafer surface and because no field oxide is employed, the stacking gate is planarized. In addition, the step height of the stacked gate is the same as that of peripheral devices. Thus, only one mask is necessary to conduct both the stacked gate and the control gate etching instead of two masks for a conventional ETOX structure.
3. The tunnel oxide, which is used for erasing, is between the source/drain regions and the floating gate and does not overlap with the channel. Therefore, the band-to-band hot hole phenomenon can be completely prevented during the erasing procedure since the conventional P/N junction formed from the source/drain region with the bulk region is not involved in this cell structure.
4. Since the portion of the tunnel oxide layer used for erasing is not located in the channel, the window close behavior coming from erasing can be avoided.
5. Because the area of the tunnel oxide layer between the source/drain and floating gate is much larger than that of the traditional structure, it can be expected that the erasing speed will be much faster also.

In accordance with this invention, a method of forming a vertical memory device on a silicon semiconductor substrate includes the following steps.

Form a silicon oxide layer on the surface of a silicon semiconductor substrate the array. Form an initial mask with a first array of parallel strips of the initial mask on the surface of the silicon oxide layer on the surface of the substrate with the first array of parallel strips being oriented in a first direction. Form a secondary, floating gate mask over the device with transverse parallel strips oriented at right angles to the first array of parallel strips. Form gate trench openings between the first array of parallel strips and the transverse parallel strips. Form a floating gate trench in the silicon semiconductor substrate through the gate trench openings, so that the trench has trench surfaces. Dope the walls of the floating gate trench with a threshold implant through the trench surfaces. Remove exposed portions of the initial mask unprotected by the secondary, floating gate mask. Form source/drain regions in the substrate self-aligned with the floating gate electrode. Strip the secondary, floating gate mask and the remainder of the first mask from the silicon oxide layer. Form a tunnel oxide layer on the trench surfaces, the tunnel oxide layer having outer surfaces. Form a floating gate electrode in the trench on the outer surfaces of the tunnel oxide layer. Form a source conductor line and a drain conductor line in the substrate in a parallel array crossing above the source/drain regions. Form an interelectrode dielectric layer over the top surface of the floating gate electrode. Form a control gate electrode over the interelectrode dielectric layer.

Preferably, the method of this invention includes the features as follows:

The trench has a depth from about 100 Å to about 10,000 Å; the tunnel oxide layer has a thickness from about 70 Å to about 200 Å, and the floating gate electrode has a thickness from about 1,000 Å to about 3,000 Å.

The threshold implant comprises ion implantation of boron fluoride ions which were ion implanted at an energy from about 10 keV to about 40 keV with a dose from about $1 \text{ E } 12$ ions/cm$^2$ to about $1 \text{ E } 14$ ions/cm$^2$.

The source/drain line implant comprises ion implantation of ions selected from the group consisting of arsenic and phosphorus which were ion implanted at an energy from about 20 keV to about 100 keV with a dose from about $1 \text{ E } 14$ ions/cm$^2$ to about $1 \text{ E } 16$ ions/cm$^2$.

The floating gate electrode comprises doped polysilicon with a thickness from about 1,000 Å to about 3,000 Å.

The source line and the drain line are formed by the step of performing doping into the substrate above the source region and the drain region aside from the trenches.

The source/drain line implant comprises ion implantation of ions selected from the group consisting of arsenic and phosphorus which were ion implanted at an energy from about 20 keV to about 100 keV with a dose from about $1 \text{ E } 14$ ions/cm$^2$ to about $1 \text{ E } 16$ ions/cm$^2$.

Preferably, the source line and the drain line are formed by the step of performing doping into the substrate above the source region and the drain region aside from the trenches to a depth from about 100 Å to about 7,000 Å.

Source/drain lines are formed to a depth from about 100 Å to about 7,000 Å by the step of source/drain line implantation on the source/drain sides of the trenches, and the source/drain line implant comprises ion implantation of ions selected from the group consisting of arsenic and phosphorus which were ion implanted at an energy from about 20 keV to about 100 keV with a dose from about 1 E 14 ions/cm$^2$ to about 1 E 16 ions/cm$^2$.

BRIEF DESCRIPTION OF THE DRAWINGS

The foregoing and other aspects and advantages of this invention are explained and described below with reference to the accompanying drawings, in which:

FIGS. 2A and 2B show the device of FIGS. 1A and 1B after etching through windows through a first photoresist mask to form active area openings in a silicon nitride layer down to the surface of a pad oxide layer.

FIGS. 3A and 3B show the device of FIGS. 2A and 2B after a floating gate photoresist mask has been formed over the device covering the top and bottom portions of the fragment of the device seen in FIG. 3A, leaving a transverse opening in the form of a slot exposing portions of the pad oxide layer exposed through the active area openings between the strips of the silicon nitride layer and floating gate mask, which is where the floating gate trenches are to be formed below the pad oxide layer.

FIGS. 4A and 4B show the device of FIGS. 3A and 3B after the pad oxide layer and substrate have been etched through active region openings to form the floating gate trenches in a row between strips of silicon nitride layer and in the slot (transverse opening) through the floating gate mask.

FIGS. 5A and 5B show the device of FIGS. 4A and 4B in which a cell threshold implant is applied at a large tilt angle Θ from the horizontal as shown in FIG. 5B to assure that the silicon in the side walls is implanted forming doped sidewall regions and base regions and the bottom surfaces, at the base of trenches to have the right dosage.

FIGS. 6A and 6B show the device of FIGS. 5A and 5B after completion of the cell threshold implant and after the exposed portion of silicon nitride layer has been removed from the slot exposed by the photoresist mask, exposing the top surface of the substrate between the trenches, after an N+ S/D ion implantation has been performed forming source/drain regions in substrate between the sidewall regions, as well as the trenches.

FIGS. 7A and 7B show the device of FIGS. 6A and 6B after the floating gate photoresist mask has been removed as shown in FIG. 7A exposing the surface of P-doped silicon substrate (above and below the row of trenches as seen in the top view in FIG. 7A) and the surface of doped sidewall regions.

FIGS. 8A and 8B show the device of FIGS. 7A and 7B after growth of a tunnel oxide layer on the exposed surfaces of sidewalls and bottom surfaces in trenches.

FIGS. 9A and 9B show the device of FIGS. 8A and 8B after S/D conductor lines were defined by S/D diffusion line mask PR3 shown in phantom in FIG. 8A to reveal the elements beneath the mask.

FIGS. 10A and 10B show the device of FIGS. 9A and 9B after the third photoresist layer for S/D diffusion lines have been removed. Then an ONO (Silicon Oxide/silicon nitride/Silicon Oxide) interelectrode dielectric layer was grown in the conventional manner. Later, the polysilicon and tungsten sulicide bilayer control gate layer was formed to be patterned into a control gate electrode.

DESCRIPTION OF THE PREFERRED EMBODIMENT

Figure 1A:
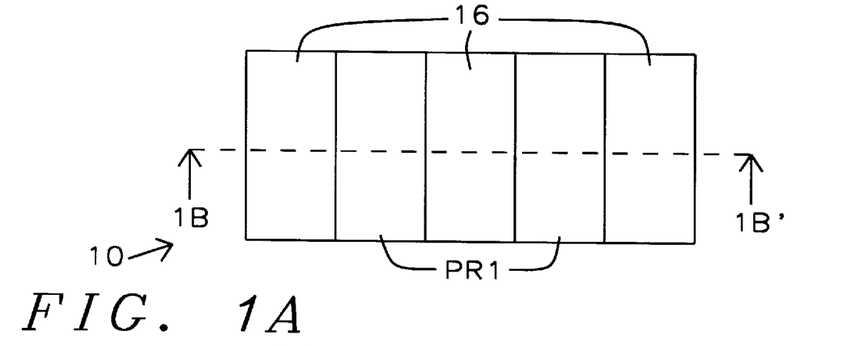
FIG. 1A shows a plan view of a fragment of a device in an early stage of the process of manufacture in accordance with the method of this invention.
Figure 1B:
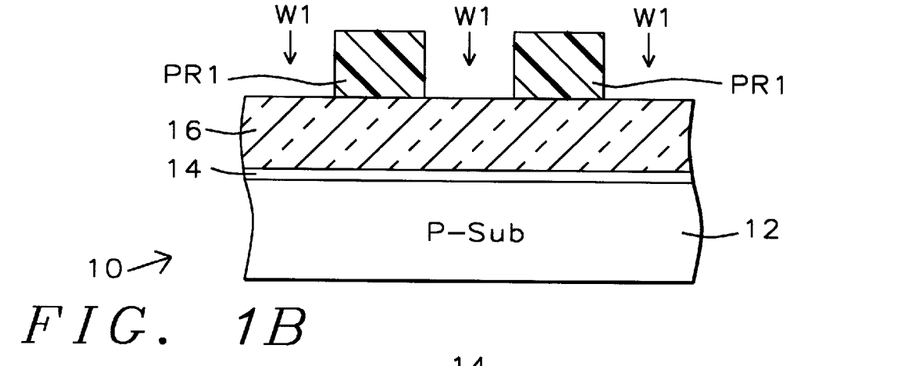
FIG. 1B is a sectional view taken along line 1B–1B' of the device of FIG. 1A.

FIG. 1A shows a plan view of a fragment of a device 10 in an early stage of the process of manufacture in accordance with the method of this invention. FIG. 1B is a sectional view taken along line 1B–1B' of the device 10 of FIG. 1A. A P-doped silicon semiconductor substrate 12 has had a pad oxide layer 14 deposited thereon. The pad oxide layer 14 is composed of a thermal silicon oxide material. Next, a thick, blanket silicon nitride layer 16 was formed over the pad oxide layer 14 An active area photoresist mask PR1 was formed over the silicon nitride layer 16 There are windows W1 through photoresist mask PR1 for patterning active area openings OD through silicon nitride layer 16, as shown in FIG. 2B.

Figure 2A:
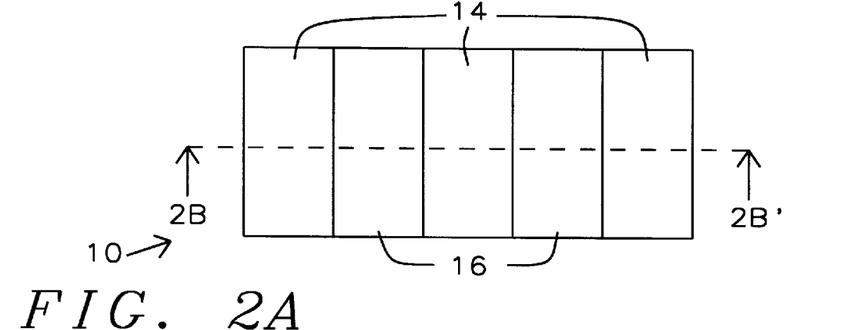
Figure 2B:
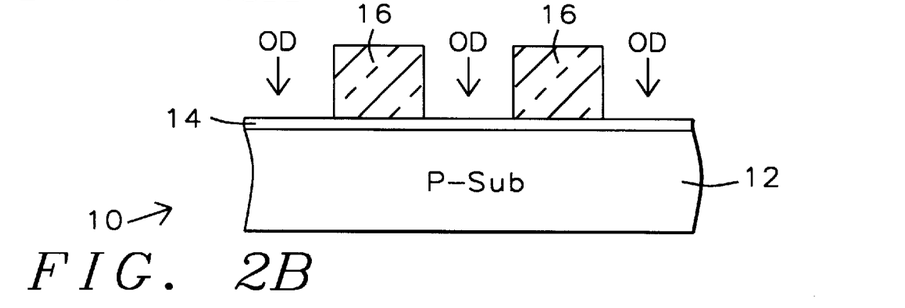
FIG. 2B is a sectional view taken along line 2B–2B' in FIG. 2A.

FIGS. 2A and 2B show the device 10 of FIGS. 1A and 1B after etching through windowsthrough photoresist mask PR1 has been used to form active area openings OD in silicon nitride layer 16 (which remains in strips between the openings OD) down to the surface of pad oxide layer 14 FIG. 2B is a sectional view taken along line 2B–2B' in FIG. 2A.

Figure 3A:
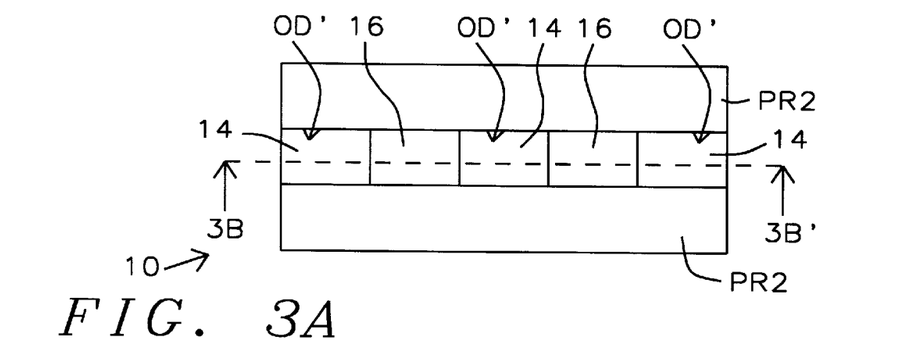
Figure 3B:
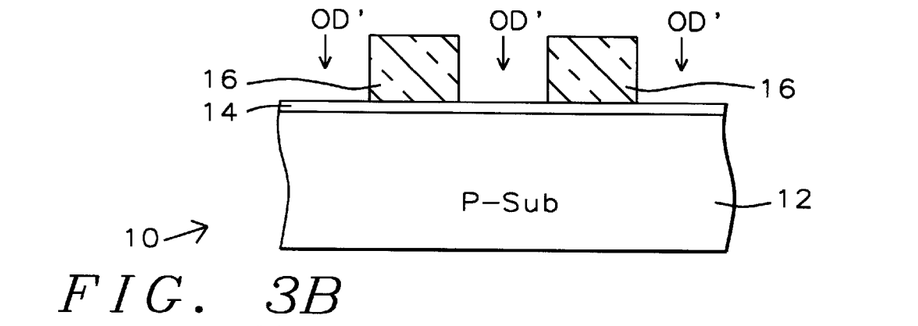
FIG. 3B is a sectional view taken along line 3B–3B' in FIG. 3A.

FIGS. 3A and 3B show the device 10 of FIGS. 2A and 2B after a floating gate photoresist mask PR2 has been formed over the device 10 covering the top and bottom portions of the fragment of the device 10 seen in FIG. 3A, leaving a transverse opening in the form of a slot exposing portions of the pad oxide layer 14 exposed through active area openings OD' between the strips of silicon nitride layer 16 and floating gate mask PR2, which is where the floating gate trenches are to be formed below the pad oxide layer 14 FIG. 3B is a sectional view taken along line 3B–3B' in FIG. 3A.

Figure 4A:
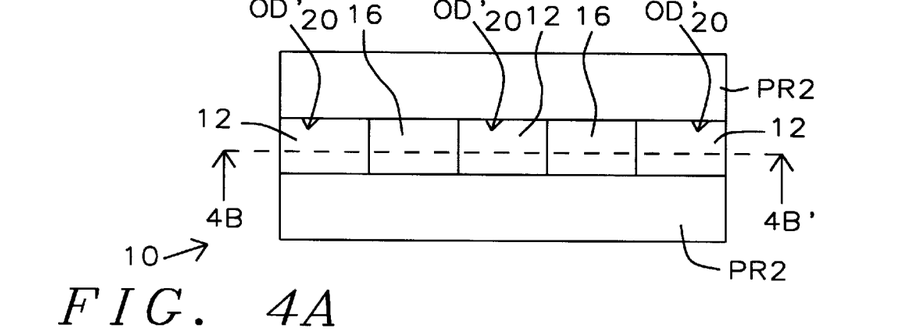
Figure 4B:
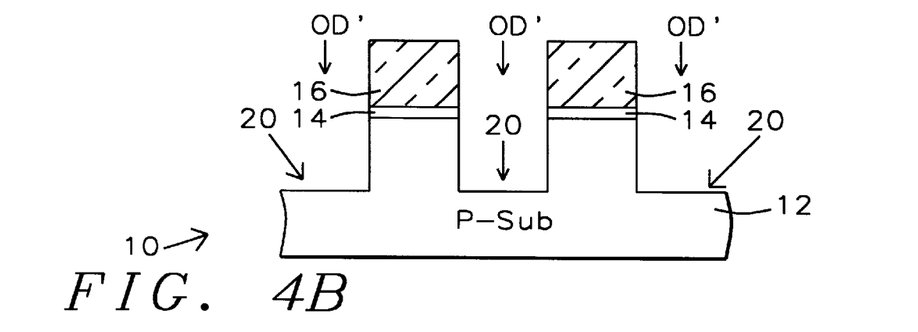
FIG. 4B is a sectional view taken along line 4B–4B' in FIG. 4A.

FIGS. 4A and 4B show the device 10 of FIGS. 3A and 3B after the pad oxide layer and substrate 12 have been etched through openings OD' to form the floating gate trenches 20 to a depth from about 1,000 Å to about 20,000 Å. Trenches 20 are aligned in a row between strips of silicon nitride layer 16 and in the slot (transverse opening) through the floating gate mask PR2 FIG. 4B is a sectional view taken along line 4B–4B' in FIG. 4A.

Figure 5A:
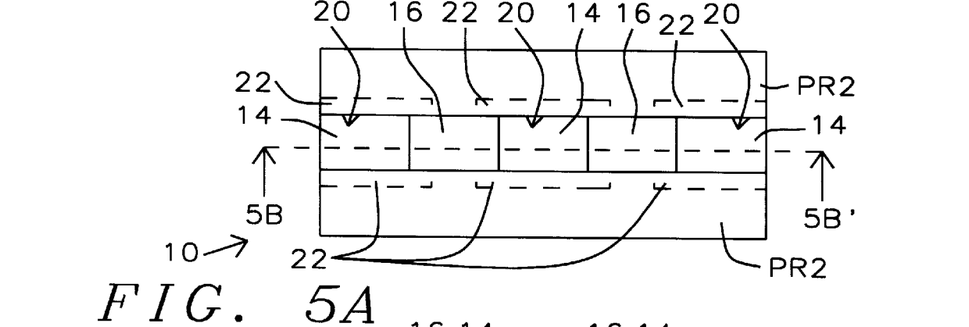
Figure 5B:
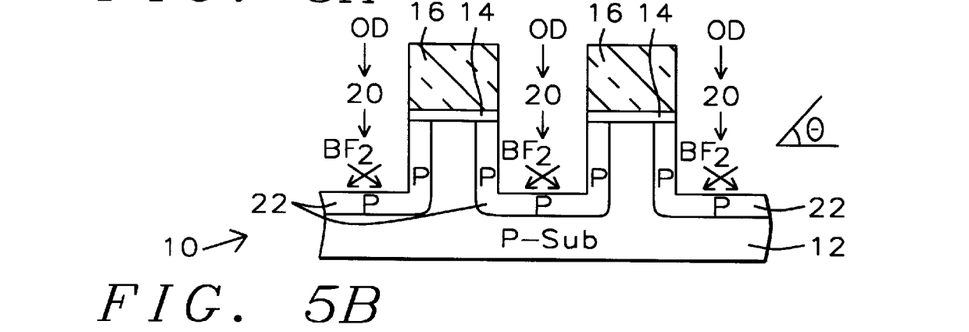
FIG. 5B is a sectional view taken along line 5B–5B' in FIG. 5A.

FIGS. 5A and 5B show the device 10 of FIGS. 4A and 4B in which a cell threshold implant of BF$_2$ ions, which are applied at a large tilt angle Θ from the horizontal as shown in FIG. 5B to assure that the silicon 12 in the side walls 22 are implanted forming P-doped sidewall regions 22 and P-doped base regions 22 and the bottom surfaces, at the base of trenches 20, to have the right dosage. The threshold implant was preferably formed by ion implanting with a dose of P type boron fluoride ($BF_2$) dopant from about 1 E 13 ions/cm² to about 1 E 14 ions/cm² at an energy from about 10 keV to about 50 keV. After annealing, the concentration of boron dopant in the P-doped sidewall and base regions 22 was from about 1 E 14 atoms/cm³ to about 1 E 16 atoms/cm³. FIG. 5B is a sectional view taken along line 5B–5B' in FIG. 5A.

Figure 6A:
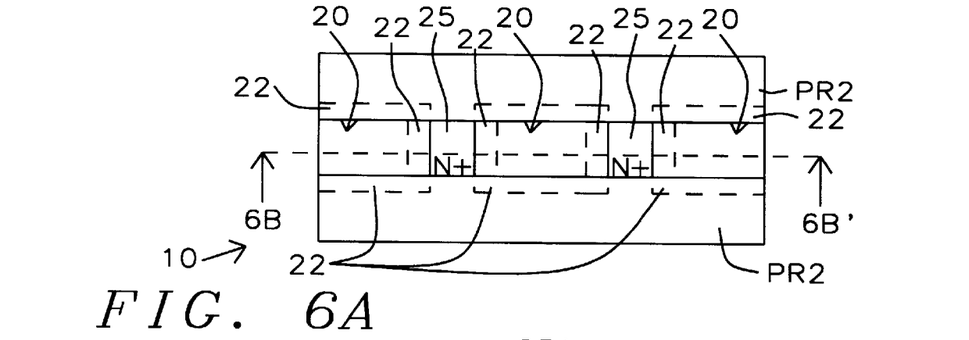
Figure 6B:
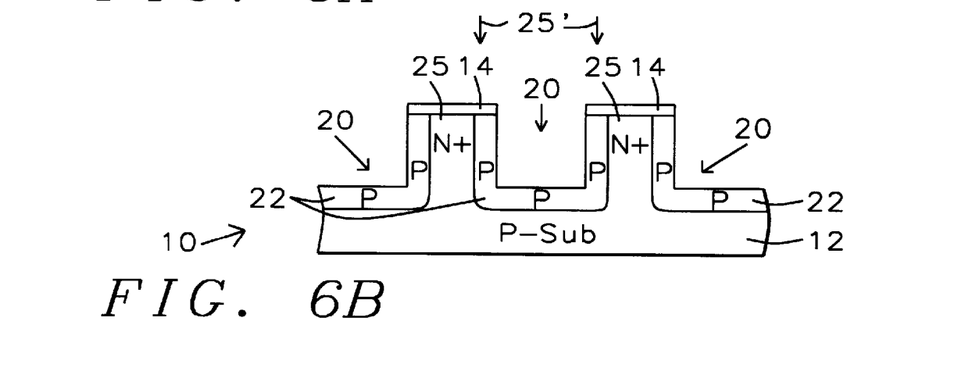
FIG. 6B is a sectional view taken along line 6B–6B' in FIG. 6A.

FIGS. 6A and 6B show the device 10 of FIGS. 5A and 5B after completion of the cell threshold implant and after the exposed portion of silicon nitride layer 16 (not covered by mask PR2) has been removed from the slot exposed by the photoresist mask PR2, exposing the top surface of the substrate 12 between the trenches 20. The device 10 is shown after an N+ S/D ion implantation has been performed with a tilt angle Θ=0 from the vertical, as shown in FIG. 6B to form source/drain regions 25 in substrate 12 between the P doped sidewall regions 22, as well as the trenches 20. The N+ S/D ion implantation was performed by ion implanting N type dopant selected from Arsenic (As75) and Phosphorus (P31) with a dose from about 1 E 14 ions/cm² to about 1 E 16 ions/cm² at an energy from about 20 keV to about 100 keV. After annealing the concentration of As/P dopant in the source/drain regions 25 was from about 1 E 19 atoms/cm³ to about 1 E 21 atoms/cm³. FIG. 6B is a sectional view taken along line 6B–6B' in FIG. 6A.

Figure 7A:
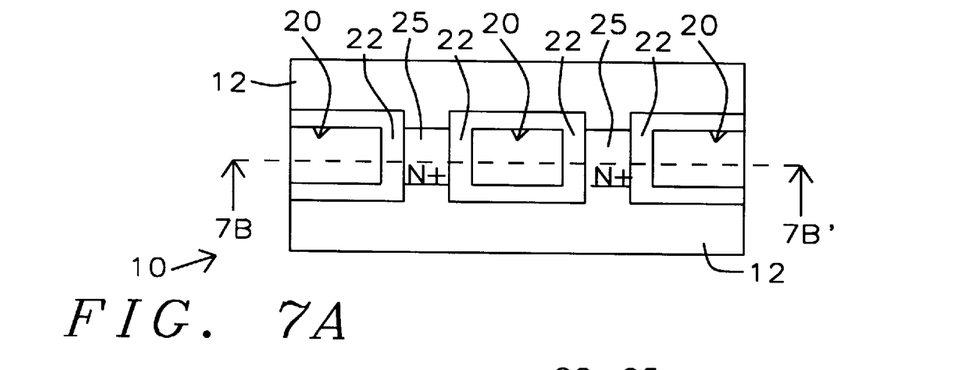
Figure 7B:
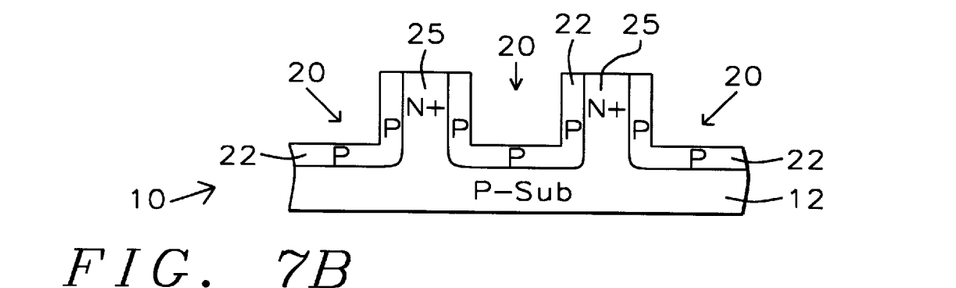
FIG. 7B is a sectional view taken along line 7B–7B' in FIG. 7A.

FIGS. 7A and 7B show the device 10 of FIGS. 6A and 6B after the floating gate photoresist mask PR2 has been removed as shown in FIG. 7A exposing the surface of P-doped silicon substrate 12 (above and below the row of trenches 20 as seen in the top view in FIG. 7A) and the surface of P doped sidewall regions 22 FIG. 7B is a sectional view taken along line 7B–7B' in FIG. 7A.

Figure 8A:
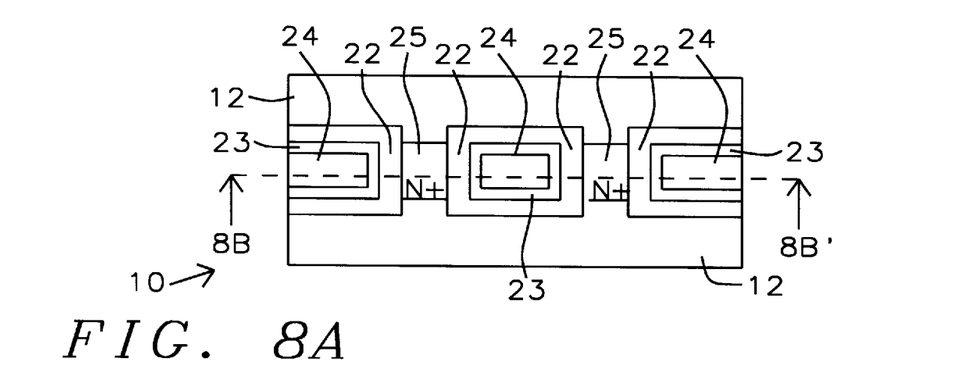
Figure 8B:
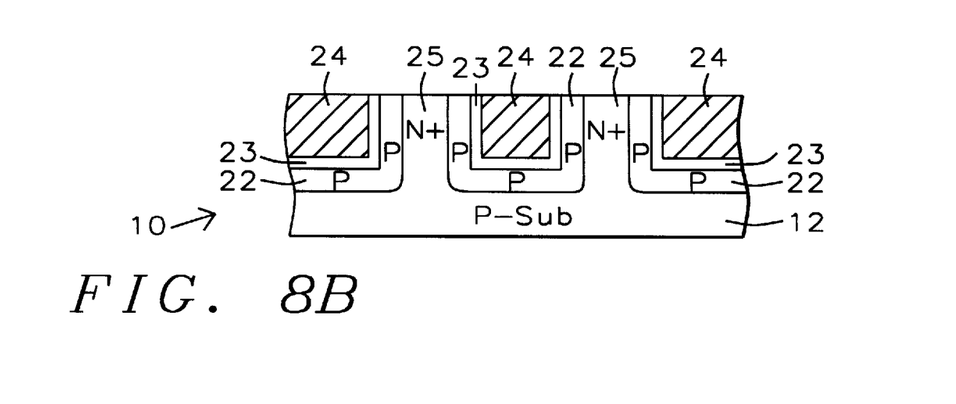
FIG. 8B is a sectional view taken along line 8B–8B' in FIG. 8A.

FIGS. 8A and 8B show the device 10 of FIGS. 7A and 7B after growth of a tunnel oxide layer 23 on the exposed surfaces of P doped sidewalls 22 and P doped bottom surfaces 22 in trenches 20 A floating gate polysilicon layer 24 is deposited to fill up the trenches 20 A subtractive processing step such as a polysilicon etch back or CMP (Chemical Mechanical Polishing) step is employed to remove the extra polysilicon above the tunnel oxide layer 23 on the source and drain as well as to planarize the very top surface producing a floating gate electrode 24 which has a thickness from about 1,000 Å to about 3,000 Å, as shown in FIG. 8. FIG. 8B is a sectional view taken along line 8B–8B' in FIG. 8A.

Figure 9A:
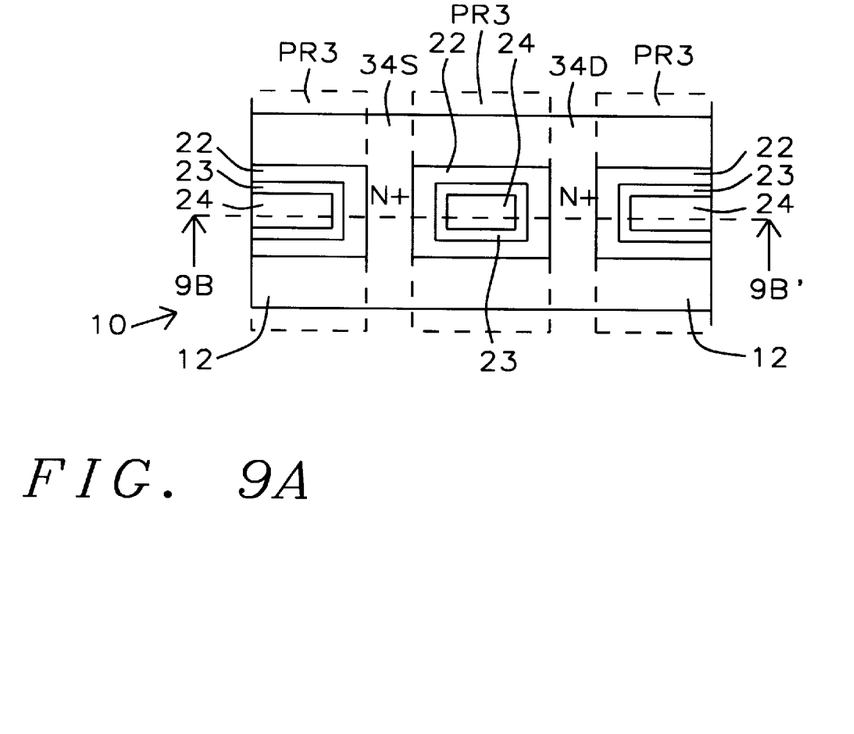
Figure 9B:
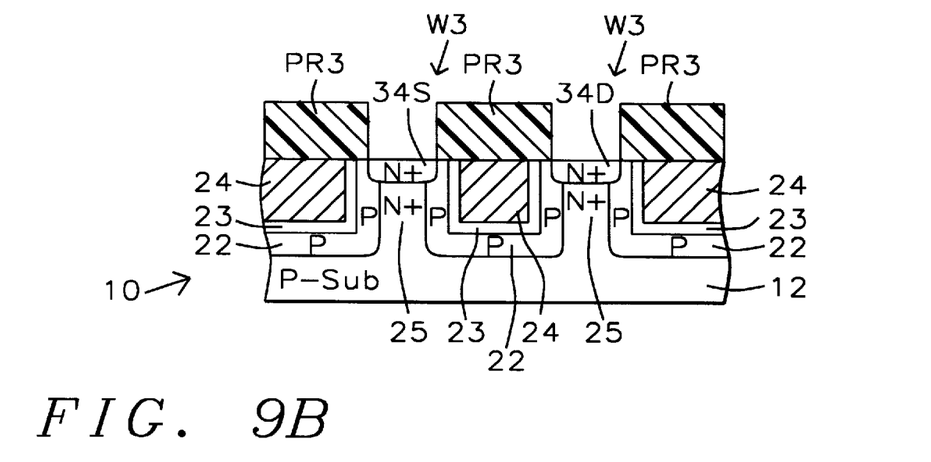
FIG. 9B is a sectional view taken along line 9B–9B' in FIG. 9A.

FIGS. 9A and 9B show the device 10 of FIGS. 8A and 8B after S/D conductor lines 34S and 34D were defined by S/D diffusion line mask PR3 shown in phantom in FIG. 8A to reveal the elements beneath the mask PR3. Mask PR3 includes a pair of parallel top to bottom slots for the conductor lines in the top view shown in FIG. 9A. The device 10 is shown after ion doping to form the N+ doped source diffusion line 34S and drain diffusion line 34D with a tilt angle of Θ=0. The source line 34S and the drain line 34D are doped to a depth from about 1,000 Å to about 6,000 Å. This a both a diffusion step and an ion implanting step. The diffusion step used is a $WSi_x$ annealing step.

The N+ ion implantation to S/D conductor lines 34S and 34D was performed by ion implanting with a dose N type dopant selected from Arsenic (As75) and Phosphorus (P31) from about 1 E 14 ions/cm² to about 1 E 16 ions/cm² at an energy from about 20 keV to about 100 keV. After annealing the concentration of As/P dopant in the source/drain regions 25 was from about 1 E 19 atoms/cm³ to about 1 E 22 atoms/cm³. FIG. 9B is a sectional view taken along line 9B–9B' in FIG. 9A.

Figure 10A:
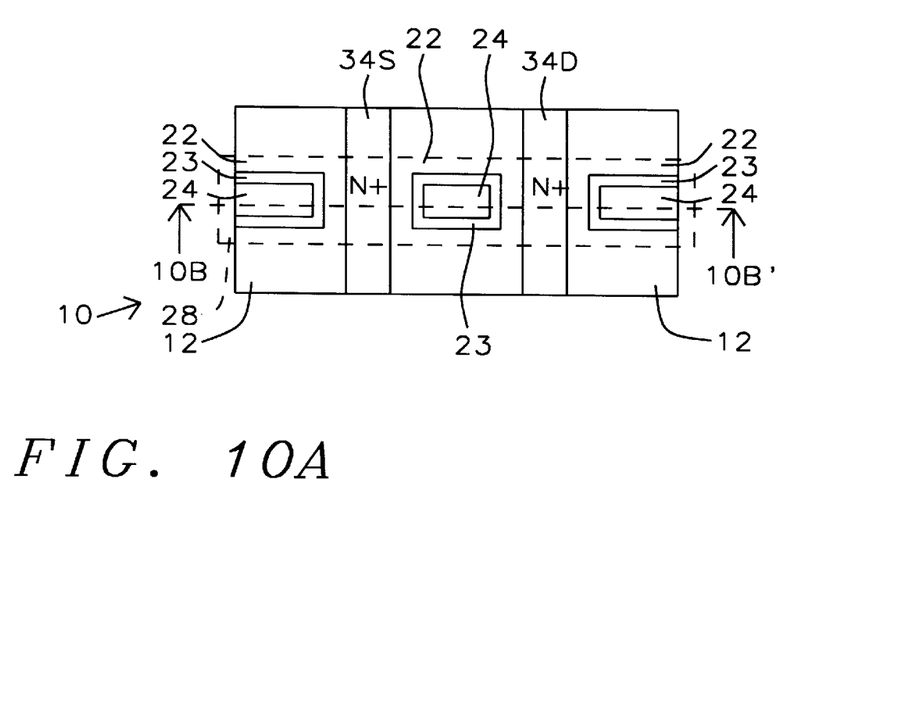
Figure 10B:
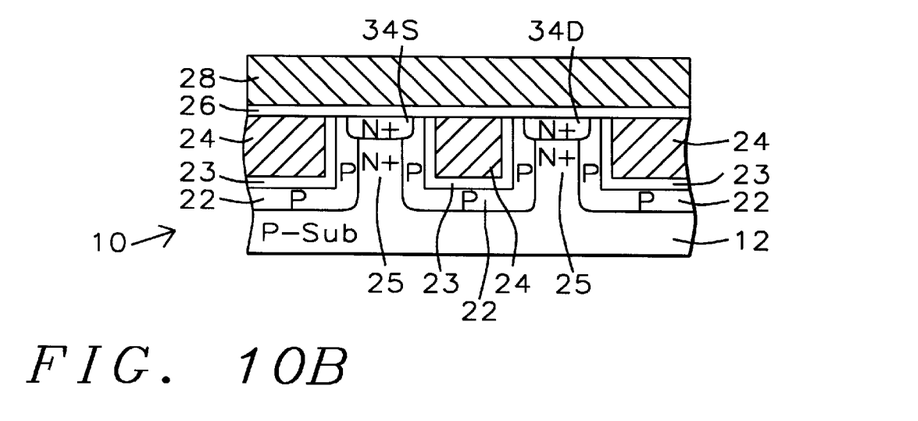
FIG. 10B is a sectional view taken along line 10B–10B' in FIG. 10A.

FIGS. 10A and 10B show the device 10 of FIGS. 9A and 9B after the third photoresist layer PR3 for S/D diffusion lines 34S and 34D has been removed. Then ONO (Silicon Oxide/silicon nitride/Silicon Oxide) interelectrode dielectric layer 26 was grown in the conventional manner. Later, a polysilicon and tungsten silicide control gate bilayer was formed and patterned with ONO layer 26 into a control gate electrode 28 The ONO layer 26, polysilicon and tungsten silicide bilayer 28 are stacked on step-by-step. The control gate electrode 28 is defined by a control gate mask as shown in FIG. 10A. FIG. 10B is a sectional view taken along line 10B–10B' in FIG. 10A.

After the step of tungsten silicide annealing ends, an ILD (Inter Layer Dielectic) layer is coated on device 10. Then a conventional contact mask is defined for the usual contact holes and the conventional contact ion implanting steps to follow. After tungsten plugs are deposited and etched back, a metal layer is coated and defined by a metal layer mask.

Then IMD (ILD), VIA and METAL masks are used to complete the back end of the process.

OPERATION MODES

Figure 11:
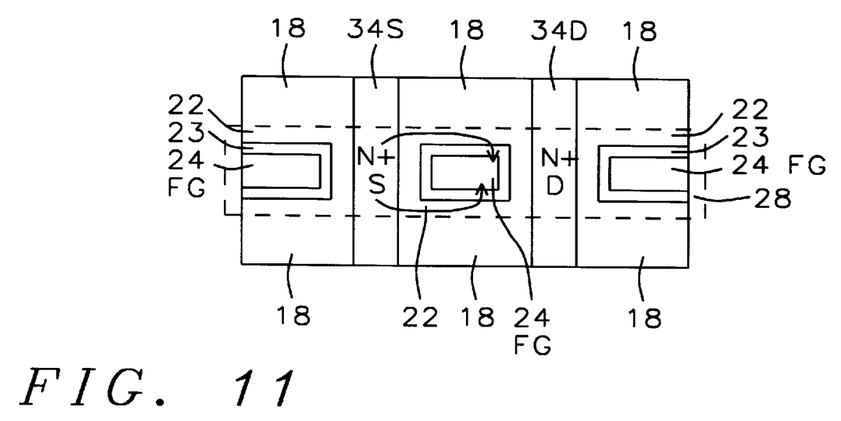
FIG. 11 shows a schematic plan view of the device of FIG. 10A for channel hot electron programming, with the hot electron paths shown on vertical channel surfaces during programming.

For channel hot electron programming a schematic plan view of the device 10 of FIG. 10A is shown in FIG. 11. The hot electron paths are shown on a vertical channel surfaces during programming, where as follows:

$V_D=V_{CC}$
$V_{CG}=V_{high}$,
$V_S=V_B=0$

Figure 12:
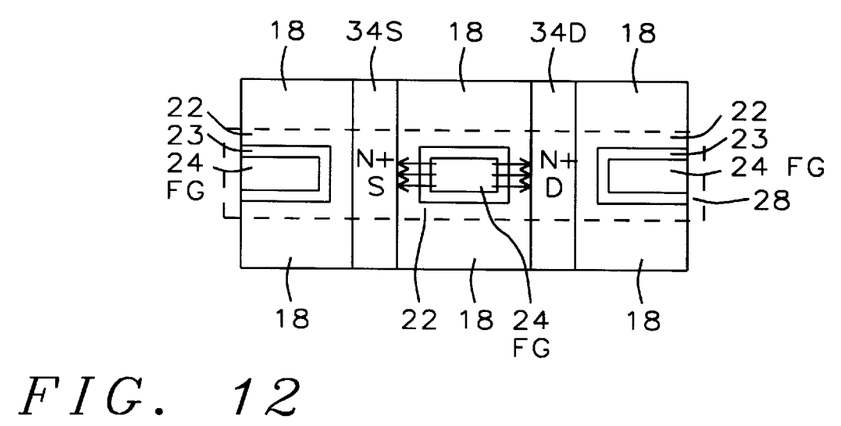
FIG. 12 shows a schematic plan view of the device of FIG. 10A for tunneling paths on source/drain sides paths during erasing.

For Fowler-Nordheim tunneling erasing the paths of electrons are shown in FIG. 12. The electron tunneling paths are shown on Source/Drain sides during erasing, where as follows:

$V_D=V_S=V_{high}$
$V_{CG}=0$,
$V_S$=Floating

Figure 13:
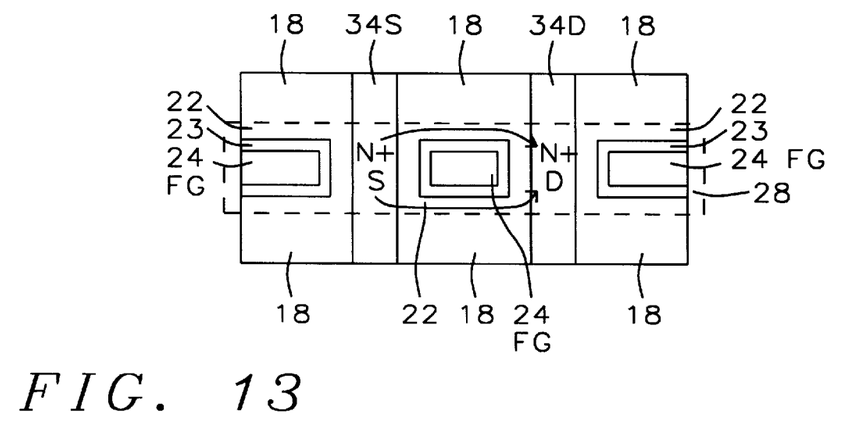
FIG. 13 shows a schematic plan view of the device of FIG. 10A for electron paths from source sides to drain sides during reading.

The reading process is shown in FIG. 13. The operation conditions of the memory cell are listed in Table I. The electron paths from source to drain sides during reading are as follows:

$V_D=V_{CC}$
$V_{CG}=V_{CC}$
$V_S=V_B=0$

TABLE I

Memory Cell Operation Condition

|  |  | Programming | Erase | Read |
|---|---|---|---|---|
| Bit Line | Selected | $V_{CC}$ | $V_{high}$ | $V_{CC}$ |
| (Drain) | Unselected | 0 | 0 | 0 |
| Word Line | Selected | $V_{high}$ | 0 | $V_{CC}$ |
| (Gate) | Unselected | 0 | 0 | 0 |
| Source | Selected | 0 | $V_{high}$ | 0 |
|  | Unselected | 0 | 0 | 0 |
| Buck | Selected | 0 | Floating | 0 |
|  | Unselected | 0 | 0 | 0 |

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a vertical memory device on a silicon semiconductor substrate with a surface by the steps as follows:

forming an oxide layer on said surface of said substrate, forming a mask structure on said silicon oxide layer with gate trench openings therethrough, forming an array of floating gate trenches extending through said oxide layer and down into said silicon semiconductor substrate by etching through said gate trench openings in said mask structure, said trenches having trench surfaces, doping the walls of said floating gate trench with a threshold implant through said trench surfaces, forming a source region and a drain region in said substrate self-aligned with said floating gate trench, forming a tunnel oxide layer on said trench surfaces, said tunnel oxide layer having outer surfaces, forming floating gate electrodes in said trenches on said outer surfaces of said tunnel oxide layer, forming a source conductor line and a drain conductor line in said substrate self-aligned with said floating gate electrode above said source region and above said drain region respectively, forming a source conductor line and a drain conductor line in said substrate in a parallel array crossing above said source/drain regions, forming an interelectrode dielectric layer over the top surface of said floating gate electrode, and forming a control gate electrode over said interelectrode dielectric layer.

2. A method of forming a memory device in accordance with claim 1 including said trench having a depth from about 1,000 Å to about 20,000 Å.

3. A method of forming a memory device in accordance with claim 1 including as follows:

said tunnel oxide layer having a thickness from about 70 Å to about 200 Å, and said floating gate electrode having a thickness from about 1,000 Å to about 3,000 Å.

4. A method of forming a memory device in accordance with claim 1 including as follows:

doping the walls of said floating gate trenches with a threshold implant through said trench surfaces, said threshold implant comprising ion implantation of boron fluoride ions which are ion implanted at an energy from about 10 keV to about 40 keV with a dose from about $1 \text{ E } 12 \text{ ions/cm}^2$ to about $1 \text{ E } 14 \text{ ions/cm}^2$.

5. A method of forming a memory device in accordance with claim 1 including said source/drain implant comprising implantation of ions selected from the group consisting of arsenic and phosphorus which are ion implanted at an energy from about 20 keV to about 100 keV with a dose from about $1 \text{ E } 14 \text{ ions/cm}^2$ to about $1 \text{ E } 16 \text{ ions/cm}^2$.

6. A method of forming a memory device in accordance with claim 1 including said floating gate electrode comprising doped polysilicon with a thickness from about 1,000 Å to about 3,000 Å.

7. A method of forming a memory device in accordance with claim 1 including as follows:

said source conductor line and said drain conductor line are formed by the step of performing doping into said substrate above said source region and said drain region aside from said trenches.

8. A method of forming a memory device in accordance with claim 1 including as follows:

a source/drain line conductor implant is provided by ion implantation of a dose of ions selected from the group consisting of arsenic and phosphorus which are ion implanted with a dose from about $1 \text{ E } 14 \text{ ions/cm}^2$ to about $1 \text{ E } 16 \text{ ions/cm}^2$, which are ion implanted at an energy from about 20 keV to about 100 keV.

9. A method of forming a memory device in accordance with claim 1 including said source conductor line and said drain conductor line being formed by the step of performing doping into said substrate above said source region and said drain region aside from said trenches to a depth from about 100 Å to about 7,000 Å.

10. A method of forming a memory device in accordance with claim 1 including as follows:

source/drain lines are formed to a depth from about 100 Å to about 7,000 Å and source/drain line implantation on the source/drain sides of said trench, and said source/drain line implant comprises ion implantation of a dose of ions selected from the group consisting of arsenic and phosphorus which were ion implanted at an energy from about 20 keV to about 100 keV with a dose from about $1 \text{ E } 14 \text{ ions/cm}^2$ to about $1 \text{ E } 16 \text{ ions/cm}^2$.

11. A method of forming a vertical memory device on a semiconductor substrate by the steps as follows:

forming a silicon oxide layer on the surface of a silicon semiconductor substrate, forming an initial mask with a first array of parallel strips of said initial mask on the surface of said silicon oxide layer on the surface of said substrate, said first array of parallel strips being oriented in a first direction, forming a secondary, floating gate mask over said device with transverse parallel strips oriented at right angles to said first array of parallel strips forming gate trench openings between said first array of parallel strips and said transverse parallel strips, forming floating gate trenches in said semiconductor substrate in an array by etching through said gate trench openings, said trenches having trench surfaces, forming source/drain regions in said substrate self-aligned with said floating gate trenches, forming a tunnel oxide layer on said trench surfaces, said tunnel oxide layer having outer surfaces, forming a floating gate electrode in said trenches on said outer surfaces of said tunnel oxide layer, forming a source conductor line and a drain conductor line in said substrate in a parallel array crossing above said source/drain regions, forming an interelectrode dielectric layer over the top surface of said floating gate electrode, and forming a control gate electrode over said interelectrode dielectric layer.

12. A method of forming a memory device in accordance with claim 11 including said trench having a depth from about 100 Å to about 10,000 Å.

13. A method of forming a memory device in accordance with claim 11 including as follows:

said tunnel oxide layer having a thickness from about 70 Å to about 200 Å, and said floating gate electrode having a thickness from about 1,000 Å to about 3,000 Å.

14. A method of forming a memory device in accordance with claim 11 including as follows:
doping the walls of said floating gate trenches with a threshold implant through said trench surfaces,
said threshold implant comprises ion implantation of boron fluoride ions which are ion implanted at an energy from about 10 keV to about 40 keV with a dose from about 1 E 12 ions/cm$^2$ to about 1 E 14 ions/cm$^2$.

15. A method of forming a memory device in accordance with claim 11 including as follows:
said source/drain implant comprises ion implantation of ions selected from the group consisting of arsenic and phosphorus which are ion implanted at an energy from about 20 keV to about 100 keV with a dose from about 1 E 14 ions/cm$^2$ to about 1 E 16 ions/cm$^2$.

16. A method of forming a memory device in accordance with claim 11 including said floating gate electrode comprising doped polysilicon with a thickness from about 1,000 Å to about 3,000 Å.

17. A method of forming a memory device in accordance with claim 11 including as follows:
said source conductor line and said drain conductor line are formed by the step of performing doping into said substrate above said source region and said drain region aside from said trenches.

18. A method of forming a memory device in accordance with claim 11 including as follows:
said floating gate electrode comprises doped polysilicon with a thickness from about 1,000 Å to about 3,000 Å,
said source conductor line and said drain conductor line are formed by the step of performing doping into said substrate above said source region and said drain region aside from said trenches,
said source/drain line implant comprises ion implantation of ions selected from the group consisting of arsenic and phosphorus which are ion implanted at an energy from about 20 keV to about 100 keV with a dose from about 1 E 14 ions/cm$^2$ to about 1 E 16 ions/cm$^2$.

19. A method of forming a memory device in accordance with claim 11 including as follows:
said source conductor line and said drain conductor line are formed by the step of performing doping into said substrate above said source region and said drain region aside from said trenches to a depth from about 100 Å to about 7,000 Å.

20. A method of forming a memory device in accordance with claim 11 including as follows:
source/drain conductor lines are formed to a depth from about 100 Å to about 7,000 Å by the step of source/drain conductor line implantation on the source/drain side of said trench, and
said source/drain conductor line implant comprises ion implantation of ions selected from the group consisting of arsenic and phosphorus which are ion implanted at an energy from about 20 keV to about 100 keV with a dose from about 1 E 14 ions/cm$^2$ to about 1 E 16 ions/cm$^2$.

21. A method of forming a vertical memory device on a silicon semiconductor substrate by the steps as follows:
forming a silicon oxide layer on the surface of a silicon semiconductor substrate,
forming an initial mask with a first array of parallel strips of said initial mask on the surface of said silicon oxide layer on the surface of said substrate, said first array of parallel strips being oriented in a first direction,
forming a secondary, floating gate mask over said device with transverse parallel strips oriented at right angles to said first array of parallel strips forming gate trench openings between said first array of parallel strips and said transverse parallel strips,
forming a floating gate trench in said silicon semiconductor substrate through said gate trench openings, said trench having trench surfaces,
doping the walls of said floating gate trench with a threshold implant through said trench surfaces,
removing exposed portions of said initial mask unprotected by said secondary, floating gate mask,
forming source/drain regions in said substrate self-aligned with said floating gate trench,
stripping said secondary, floating gate mask and the remainder of said first mask from said silicon oxide layer,
forming a tunnel oxide layer on said trench surfaces, said tunnel oxide layer having outer surfaces,
forming a floating gate electrode in said trench on said outer surfaces of said tunnel oxide layer between said source/drain regions,
forming a source conductor line and a drain conductor line in said substrate in a parallel array crossing above said source/drain regions,
forming an interelectrode dielectric layer over the top surface of said floating gate electrode, and
forming a control gate electrode over said interelectrode dielectric layer.

22. A method of forming a memory device in accordance with claim 21 including said trench having a depth from about 100 Å to about 10,000 Å.

23. A method of forming a memory device in accordance with claim 21 including as follows:
said tunnel oxide layer having a thickness from about 70 Å to about 200 Å, and
said floating gate electrode having a thickness from about 1,000 Å to about 3,000 Å.

24. A method of forming a memory device in accordance with claim 21 including said threshold implant comprising ion implantation of boron fluoride ions which are ion implanted at an energy from about 10 keV to about 40 keV with a dose from about 1 E 12 ions/cm$^2$ to about 1 E 14 ions/cm$^2$.

25. A method of forming a memory device in accordance with claim 21 including said source/drain conductor line implant comprising ion implantation of ions selected from the group consisting of arsenic and phosphorus which are ion implanted at an energy from about 20 keV to about 100 keV with a dose from about 1 E 14 ions/cm$^2$ to about 1 E 16 ions/cm$^2$.

26. A method of forming a memory device in accordance with claim 21 including said floating gate electrode comprising doped polysilicon with a thickness from about 1,000 Å to about 3,000 Å.

27. A method of forming a memory device in accordance with claim 21 including said source conductor line and said drain conductor line being formed by the step of performing doping into said substrate above said source region and said drain region aside from said trenches.

28. A method of forming a memory device in accordance with claim 21 including as follows:

said source conductor line and said drain conductor line being formed by the step of performing doping into said substrate above said source region and said drain region aside from said trenches, and said source/drain conductor line implant comprises ion implantation of ions selected from the group consisting of arsenic and phosphorus which are ion implanted at an energy from about 20 keV to about 100 keV with a dose from about 1 E 14 ions/cm$^2$ to about 1 E 16 ions/cm$^2$.

29. A method of forming a memory device in accordance with claim 21 including said source conductor line and said drain conductor line are formed by the step of performing doping into said substrate above said source region and said drain region aside from said trenches to a depth from about 100 Å to about 7,000 Å.

30. A method of forming a memory device in accordance with claim 21 including as follows:

source/drain conductor lines are formed to a depth from about 100 Å to about 7,000 Å by the step of source/drain line implantation on the source/drain sides of said trenches, and said source/drain line implant comprises ion implantation of ions selected from the group consisting of arsenic and phosphorus which are ion implanted at an energy from about 20 keV to about 100 keV with a dose from about 1 E 14 ions/cm$^2$ to about 1 E 16 ions/cm$^2$.

31. A method of forming a memory device in accordance with claim 1 including doping the walls of said floating gate trenches with a threshold implant through said trench surfaces.

32. A method of forming a memory device in accordance with claim 11 including doping the walls of said floating gate trenches with a threshold implant through said trench surfaces.

* * * * *